(12) United States Patent
Minervini et al.

(10) Patent No.: US 10,142,718 B2
(45) Date of Patent: Nov. 27, 2018

(54) INTEGRATED TEMPERATURE SENSOR IN MICROPHONE PACKAGE

(71) Applicant: INVENSENSE, INC., San Jose, CA (US)

(72) Inventors: Anthony D. Minervini, Palos Hills, IL (US); Kieran Harney, Andover, MA (US); Aleksey S. Khenkin, Nashua, NH (US); Baris Cagdaser, Sunnyvale, CA (US)

(73) Assignee: Invensense, Inc., San Jose, CA (US)

( * ) Notice: Subject to any disclaimer, the term of this patent is extended or adjusted under 35 U.S.C. 154(b) by 427 days.

(21) Appl. No.: 14/856,262

(22) Filed: Sep. 16, 2015

(65) Prior Publication Data

US 2016/0165330 A1    Jun. 9, 2016

Related U.S. Application Data

(60) Provisional application No. 62/087,716, filed on Dec. 4, 2014.

(51) Int. Cl.
*G01K 13/00* (2006.01)
*G01K 1/14* (2006.01)
(Continued)

(52) U.S. Cl.
CPC ............. *H04R 1/028* (2013.01); *G01K 13/00* (2013.01); *H04R 19/005* (2013.01); *H04R 19/04* (2013.01);
(Continued)

(58) Field of Classification Search
CPC ........ G01K 11/22; G01K 11/265; G01K 1/00; G01K 13/00; G01K 1/14; G01K 1/16;
(Continued)

(56) References Cited

U.S. PATENT DOCUMENTS 7,192,819 B1    3/2007    Padmanabhan et al.
7,726,184 B2    6/2010    Cook et al.
(Continued)

FOREIGN PATENT DOCUMENTS

| EP | 1400149 A2 | 3/2004 | |
|---|---|---|---|
| WO | 8707723 A1 | 12/1987 | |
| WO | WO 02099384 A2 * | 12/2002 | ......... A61B 5/02007 |

OTHER PUBLICATIONS

European Office Action for European Patent Application No. 15823848.5 dated Jul. 11, 2017, 2 pages.
(Continued)

*Primary Examiner* — Gail Kaplan Verbitsky
(74) *Attorney, Agent, or Firm* — Amin, Turocy & Watson, LLP

(57) ABSTRACT

Various embodiments provide for an integrated temperature sensor and microphone package where the temperature sensor is located in, over, or near an acoustic port associated with the microphone. This placement of the temperature sensor near the acoustic port enables the temperature sensor to more accurately determine the ambient air temperature and reduces heat island interference cause by heat associated with the integrated circuit. In an embodiment, the temperature sensor can be a thermocouple formed over a substrate, with the temperature sensing portion of the thermocouple formed over the acoustic port. In another embodiment, the temperature sensor can be formed on an application specific integrated circuit that extends into or over the acoustic port. In another embodiment, a thermally conductive channel in a substrate can be placed near the acoustic port to enable the temperature sensor to determine the ambient temperature via the channel.

21 Claims, 7 Drawing Sheets

(51) Int. Cl.
*G01K 1/16* (2006.01)
*H04R 1/02* (2006.01)
*H04R 19/00* (2006.01)
*H04R 19/04* (2006.01)

(52) U.S. Cl.
CPC .. *B81B 2201/0278* (2013.01); *H04R 2231/00* (2013.01)

(58) Field of Classification Search
CPC ............ G01N 2291/02881; A61B 8/00; B81B 2201/0278; H04R 19/04
USPC .......................................... 374/141, 142, 100
See application file for complete search history.

(56) References Cited

U.S. PATENT DOCUMENTS

| | | | |
|---|---|---|---|
| 8,230,738 B2 | 7/2012 | Radziszewski et al. | |
| 8,571,239 B2 | 10/2013 | Feiertag et al. | |
| 8,587,183 B2 | 11/2013 | Chen et al. | |
| 8,794,065 B1* | 8/2014 | Yang | G01P 1/023 |
| | | | 73/493 |
| 8,866,237 B2 | 10/2014 | Manack et al. | |
| 9,809,448 B2* | 11/2017 | Lim | B81B 7/0061 |
| 9,933,319 B2* | 4/2018 | Li | G01K 11/24 |
| 2006/0236973 A1* | 10/2006 | Seibt | F02M 35/125 |
| | | | 123/198 E |
| 2007/0052970 A1* | 3/2007 | Kolosov | G01F 23/2966 |
| | | | 356/478 |
| 2010/0195851 A1 | 8/2010 | Buccafusca | |
| 2012/0269363 A1 | 10/2012 | Suvanto | |
| 2013/0320514 A1 | 12/2013 | Romig et al. | |
| 2013/0328643 A1 | 12/2013 | Martin | |
| 2014/0112371 A1 | 4/2014 | Yang et al. | |
| 2014/0112510 A1 | 4/2014 | Yang et al. | |
| 2014/0146982 A1 | 5/2014 | Pelosi | |
| 2014/0193018 A1 | 7/2014 | Lim et al. | |
| 2014/0371631 A1 | 12/2014 | Fontana | |
| 2015/0264463 A1* | 9/2015 | Kuzuyama | H04R 19/005 |
| | | | 381/174 |
| 2015/0362362 A1* | 12/2015 | Pan | G01H 11/06 |
| | | | 73/645 |
| 2016/0011020 A1* | 1/2016 | Ehrenpfordt | G01D 11/245 |
| | | | 73/431 |
| 2016/0234604 A1* | 8/2016 | Saxena | H04R 19/04 |
| 2017/0188851 A1* | 7/2017 | LeBoeuf | A61B 5/02055 |
| 2017/0190571 A1* | 7/2017 | Tsai | B81B 7/02 |
| 2017/0238107 A1* | 8/2017 | Walther | H04R 29/004 |
| | | | 381/58 |

OTHER PUBLICATIONS

International Search Report and Written Opinion for International Application No. PCT/US2015/063465 dated Jun. 7, 2016, 14 pages.
Office Action for European Application Serial No. 15823848.5 dated Mar. 9, 2018, 5 pages.

* cited by examiner

INTEGRATED TEMPERATURE SENSOR IN MICROPHONE PACKAGE

PRIORITY CLAIM

This patent application is a non-provisional application that claims priority to U.S. Provisional Patent Application Ser. No. 62/087,716, filed on Dec. 4, 2014, entitled "INTEGRATED TEMPERATURE SENSOR IN MICROPHONE PACKAGE" the entirety of which is incorporated by reference herein.

TECHNICAL FIELD

The subject disclosure relates to an integrated temperature sensor and microphone package where the temperature sensor is placed in or near an acoustic port to obtain ambient air temperature.

BACKGROUND

Integrated circuits can include temperature sensors to determine the ambient temperature. The temperature can be recorded for many reasons, including to calibrate certain functions on the integrated circuit, determine environmental context as part of a sensor package on the integrated circuit, and for many other reasons. The accuracy of the recorded temperature is not only based on the sensitivity and correct calibration of the temperature sensor, but also in the placement of the temperature sensor. The temperatures determined by the temperature sensors when the temperature sensors are integrated into an integrated circuit can be based not just on the ambient air temperature, but also on heat that may be associated with the integrated circuit itself. Reducing this miniature heat island effect can improve the accuracy and sensitivity of the temperature sensors.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented layer.

In a non-limiting example, a device can comprise a microphone sensor coupled to a substrate. The device can also include an acoustic port in the substrate that exposes a portion of the microphone sensor. The device can also include a temperature sensor that overlays a portion of the port.

In another non-limiting example, a method for forming an integrated temperature sensor can include providing a microphone sensor coupled to a substrate. The method can also include forming a laminate lid over the microphone sensor and forming a temperature sensor on the laminate lid. The method can also include ablating away a portion of the laminate lid over the microphone sensor to form an acoustic port, wherein the etching does not etch away the microphone sensor.

In yet another non-limiting example, a device can include a substrate with an acoustic port and a microphone sensor coupled to the substrate, wherein the microphone sensor is over the acoustic port. The device can also include an application specific integrated circuit adjacent to the microphone, wherein the application specific integrated circuit is also coupled to the substrate and comprises a temperature sensing area. The device can also include a thermally conductive channel in the substrate bordering the temperature sensing area of the application specific integrated circuit.

The following description and the drawings contain certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Overview

Figure 1:
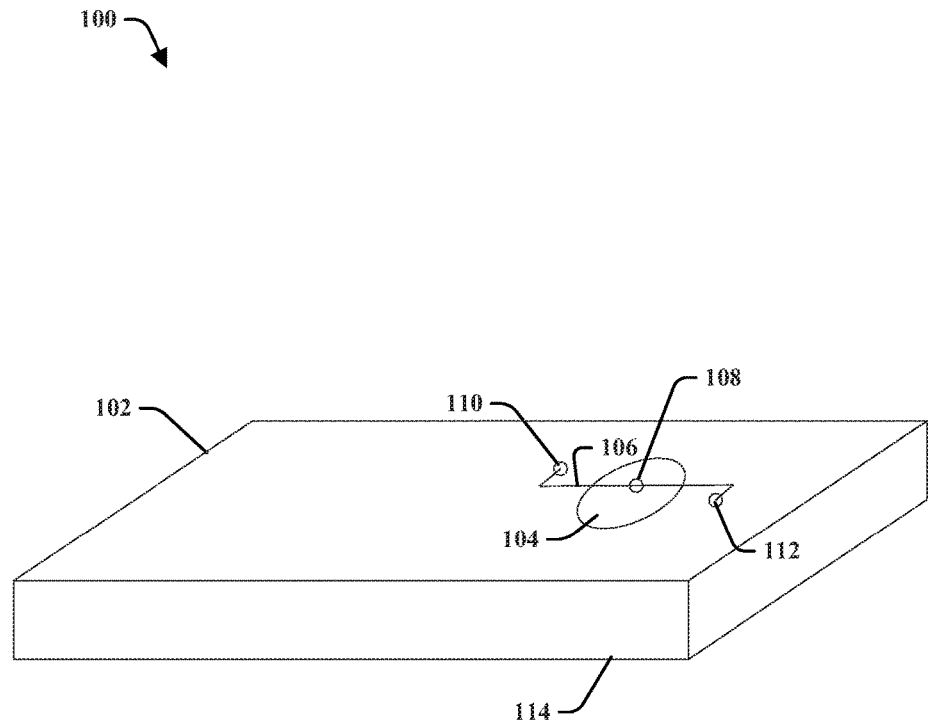
FIG. 1 depicts a non-limiting schematic diagram of an exemplary integrated sensor and microphone package with a thermocouple sensor over an acoustic port of a microphone according to various non-limiting aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the subject disclo-
} sure are described in the context of MEMS sensors. However, as further detailed below, various exemplary implementations can be applied to other areas of application specific integrated circuit board that perform analog to digital and digital to analog conversion of low amplitude signals, without departing from the subject matter described herein.

As used herein, the terms MEMS sensor, MEMS accelerometer, MEMS gyroscope, MEMS inertial sensor, MEMS acoustic sensor(s), MEMS audio sensor(s), and the like are used interchangeably unless context warrants a particular distinction among such terms. For instance, the terms can refer to MEMS devices or components that can measure acceleration, rate of rotation, a proximity, determine acoustic characteristics, generate acoustic signals, or the like.

Additionally, terms such as "at the same time," "common time," "simultaneous," "simultaneously," "concurrently," "substantially simultaneously," "immediate," and the like are employed interchangeably throughout, unless context warrants particular distinctions among the terms. It should be appreciated that such terms can refer to times relative to each other and may not refer to an exactly simultaneously action(s). For example, system limitations (e.g., download speed, processor speed, memory access speed, etc.) can account for delays or unsynchronized actions. In other embodiments, such terms can refer to acts or actions occurring within a period that does not exceed a defined threshold amount of time.

Various embodiments provide for an integrated temperature sensor and microphone package where the temperature sensor is located in, over, or near an acoustic port associated with the microphone. This placement of the temperature sensor near the acoustic port enables the temperature sensor to more accurately determine the ambient air temperature and reduces heat island interference cause by heat associated with the integrated circuit. In an embodiment, the temperature sensor can be a thermocouple formed over a substrate, with the temperature sensing portion of the thermocouple formed over the acoustic port. In another embodiment, the temperature sensor can be formed on an application specific integrated circuit that extends into or over the acoustic port. In another embodiment, a thermally conductive channel in a substrate can be placed near the acoustic port to enable the temperature sensor to determine the ambient temperature via the channel.

Various other configurations or arrangements are described herein. It is noted that the various embodiments can include other components and/or functionality. It is further noted that the various embodiments can be included in larger systems, including, smart televisions, smart phones or other cellular phones, wearables (e.g., watches, headphones, etc.), tablet computers, electronic reader devices (i.e., e-readers), laptop computers, desktop computers, monitors, digital recording devices, appliances, home electronics, handheld gaming devices, remote controllers (e.g., video game controllers, television controllers, etc.), automotive devices, personal electronic equipment, medical devices, industrial systems, cameras, and various other devices or fields.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

FIG. 1 illustrates an exemplary integrated sensor and microphone package 100 with a thermocouple sensor over an acoustic port of a microphone according to various non-limiting aspects of the subject disclosure.

In the embodiment shown in FIG. 1, a surface 102 of a integrated sensor and microphone package 100 can have an acoustic port 104 which facilitates the microphone 114 in the microphone package 100 to sense sound waves. Formed over the acoustic port 104 can be a thermocouple 106 that has thermocouple terminals 110 and 112 formed on the surface 102. A temperature sensing portion 108 of the thermocouple (where the two dissimilar metals form a junction) can be formed such that it is over the acoustic port. This configuration allows the temperature sensing portion 108 of the thermocouple 106 to be in freespace and/or an open area over the acoustic port and can facilitate an accurate and sensitive temperature reading without being affected by the thermal mass of the microphone package 100. In other embodiments, the thermocouple junction 108 could be placed next to the acoustic port 104 without spanning the port 104.

In the embodiment shown in FIG. 1, a thermocouple is used to detect temperature. A thermocouple is a device consisting of two dissimilar conductors or semiconductors that contact each other at one or more points. A thermocouple produces a voltage when the temperature of one of the contact points differs from the temperature of another, in a process known as the thermoelectric effect. In other embodiments, other types of temperature sensing devices can be utilized including resistance thermometers, where the resistance thermometer is a single homogenous metal alloy that has a very high temperature coefficient of resistance. When the temperature changes, the resistance changes which can be measured to determine changes in temperature.

The surface 102 can be an end of a substrate in which an integrated circuit comprising the microphone 114 is formed. The acoustic port 104 can thus be formed in the substrate to expose the microphone 114. In other embodiments, the surface 102 can be a laminate lid formed over the microphone 114. The thermocouple 106 can be formed on top of the lid after the acoustic port 104 is formed in some embodiments. In other embodiments, the thermocouple 106 can be formed in or on the substrate or lid, and then the acoustic port 106 can be formed around the thermocouple 106. In an embodiment, the acoustic aperture 106 can be formed by laser ablation where the laser is selected to only ablate the laminate materials forming the surface 102. This ablation can leave a wire comprising the thermocouple 106 suspended over the acoustic aperture 104.

In an embodiment, the microphone 114 in the microphone package 100 can be a MEMs microphone. Additionally, in an embodiment, a thickness of the thermocouple 106 wires can be between 75 and 100 microns in order to minimize the impact on the audio sensitivity and microphone performance.

Figure 2:
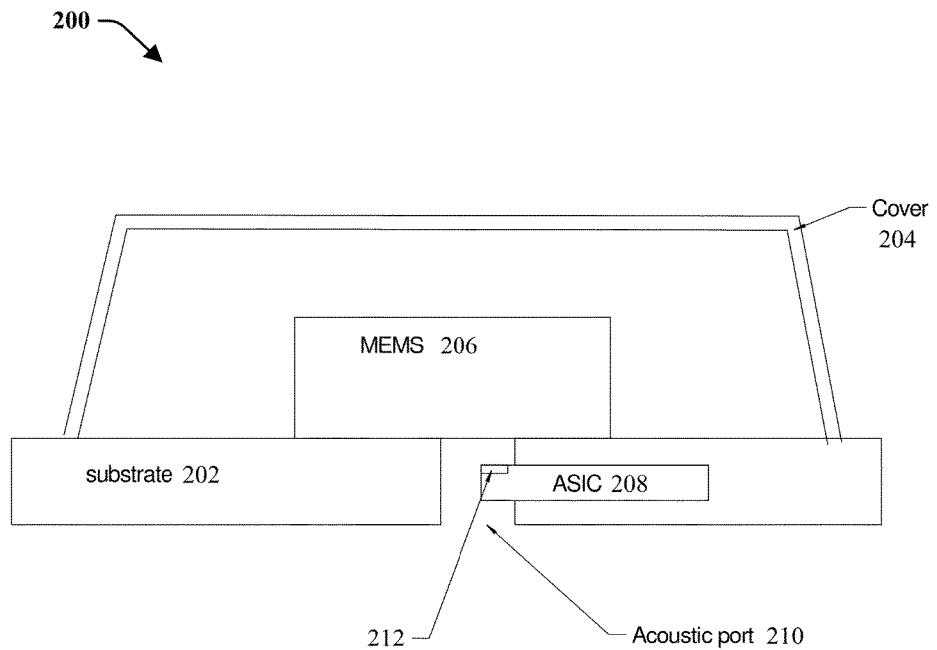
FIG. 2 depicts a non-limiting schematic diagram of an exemplary integrated sensor and microphone package with a temperature sensor on an application specific integrated circuit embedded in a substrate according to various non-limiting aspects of the subject disclosure.

Turning now to FIG. 2, illustrated is a non-limiting schematic diagram of an exemplary integrated sensor and microphone package 200 with a temperature sensor on an application specific integrated circuit embedded in a substrate according to various non-limiting aspects of the subject disclosure. In the embodiment shown in FIG. 2, a temperature sensor 212 can be formed on an application specific integrated circuit 208 that is embedded in a substrate 202. The MEMs microphone sensor 206 can be formed on the substrate 202, with an acoustic port 210 formed in the substrate 202. A lid or cover 204 can be formed over the MEMs microphone 206 and the substrate 202.

In an embodiment, the temperature sensing portion 212 can be formed on the top or bottom of the ASIC 208 (i.e., the near or far side of the ASIC 208 relative to the MEMs microphone 206. In an embodiment, the area of the ASIC 208 near the temperature sensor 212 can be thermally conductive. In some embodiments, portions of the ASIC 208 that are embedded in the substrate 202 can be selected to be relatively less thermally conductive so that heat from the substrate 202 does not conduct through the ASIC 208 to affect the temperature measurements by the temperature sensing portion 212 of the ASIC 208.

The ASIC 208 can be formed or embedded in the substrate 202 during formation of the substrate 202, and then the acoustic port 210 can be formed via laser ablation or etching of the substrate 202, leaving the ASIC 208 and the temperature sensor 212 exposed in the acoustic port 210. The materials forming the substrate 202 can be selected to facilitate etching and/or ablation of the substrate material to expose the ASIC.

In an embodiment, the temperature sensing portion 212 can be a thermocouple. In other embodiments, other types of temperature sensing devices can be utilized including resistance thermometers, where the resistance thermometer is a single homogenous metal alloy that has a very high temperature coefficient of resistance. When the temperature changes, the resistance changes which can be measured to determine changes in temperature. In other embodiments, other types of temperature sensors such as thermostats and/or thermistors.

Figure 3:
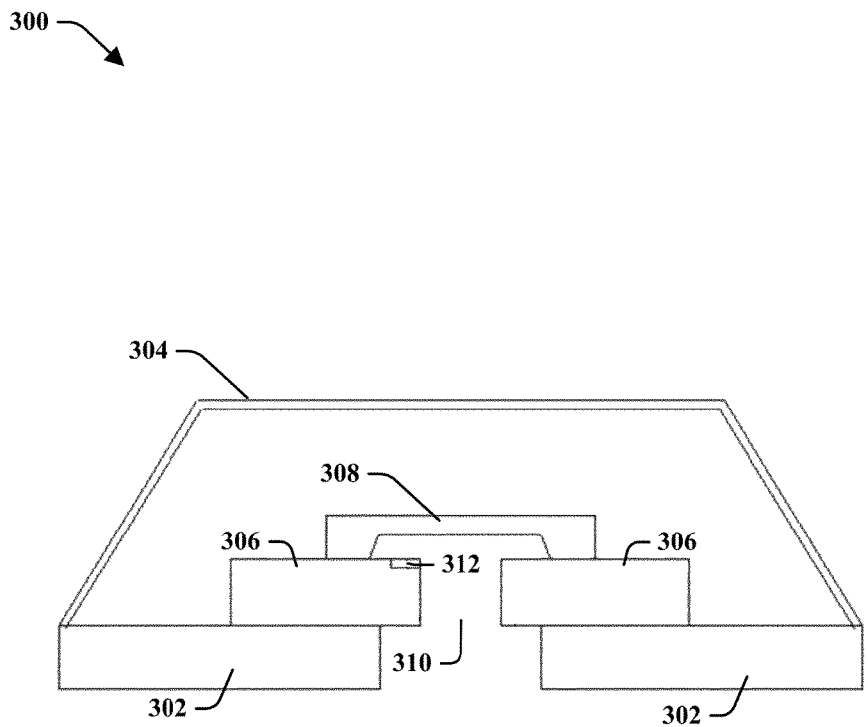
FIG. 3 depicts a non-limiting schematic diagram of an exemplary integrated sensor and microphone package with a temperature sensor on an application specific integrated circuit that forms part of an integrated die according to various non-limiting aspects of the subject disclosure.

Turning now to FIG. 3, illustrated is a non-limiting schematic diagram of an exemplary integrated sensor and microphone package with a temperature sensor on an application specific integrated circuit that forms part of an integrated die according to various non-limiting aspects of the subject disclosure.

In an embodiment, a temperature sensing area 312 of an application specific integrated circuit 306 can be formed on a substrate 302 of an integrated die. Instead of the ASIC 306 being embedded into the substrate 302 (as shown in FIG. 2) the ASIC 306 can form a part of an integrated die with the microphone 308, and a aperture can be formed in the ASIC 306 congruent with the acoustic port 310 in the substrate 302 to facilitate the microphone functionality. The temperature sensor 312 that is integrated into the circuitry of the ASIC 306 can be formed on either the top or the bottom of the ASIC 306 relative to the microphone and substrate in various embodiments.

In an embodiment, the microphone 308 and the ASIC 306 can be part of an integrated die, and in some embodiments, the microphone 308 can have a flip-chip connection to the ASIC 306 which can also have a flip-chip connection to the substrate 302. A lid 304 can be formed over the package 300.

Figure 4:
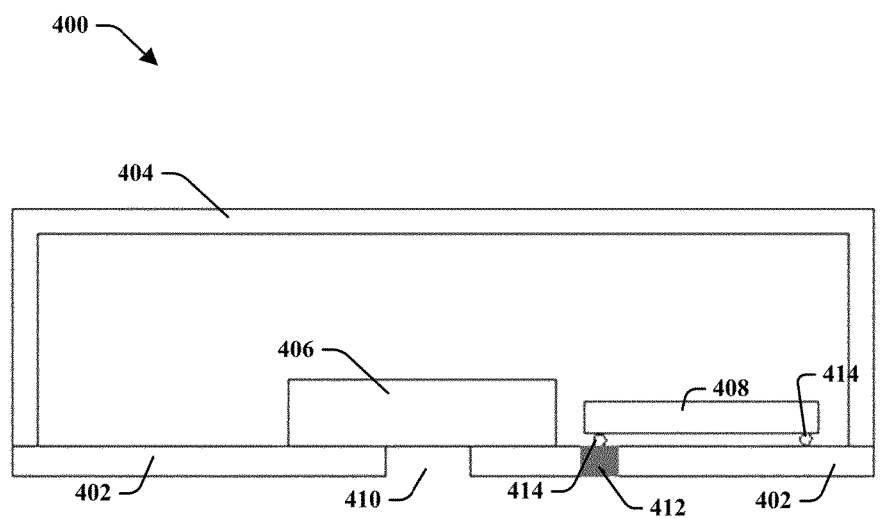
FIG. 4 depicts a non-limiting schematic diagram of an exemplary integrated sensor and microphone package with a thermally conductive channel in a substrate according to various non-limiting aspects of the subject disclosure.

Turning now to FIG. 4, depicted is a non-limiting schematic diagram of an exemplary integrated sensor and microphone package 400 with a thermally conductive channel in a substrate according to various non-limiting aspects of the subject disclosure. The thermally conductive channel 412 can be formed in the substrate 402 to facilitate the temperature sensing portion on the ASIC 408 to accurately detect the ambient air temperature even without being exposed to the air. The thermally conductive channel 412 can equalize in temperature to the ambient temperature of the surroundings, and then be coupled to a contact 414 of the ASIC 408 that is flip-chip mounted to the substrate 402. The temperature sensing portion of the ASIC 408 can be located adjacent to or near to the contact point 414. The ASIC 408 can be mounted next to a microphone 406 that is mounted over an acoustic port 410. A lid 404 can be formed over the package 400.

In an embodiment, the thermally conductive channel 412 can be formed from copper or another material that has low thermal resistance in order to quickly equalize in temperature with the surroundings.

Figure 5:
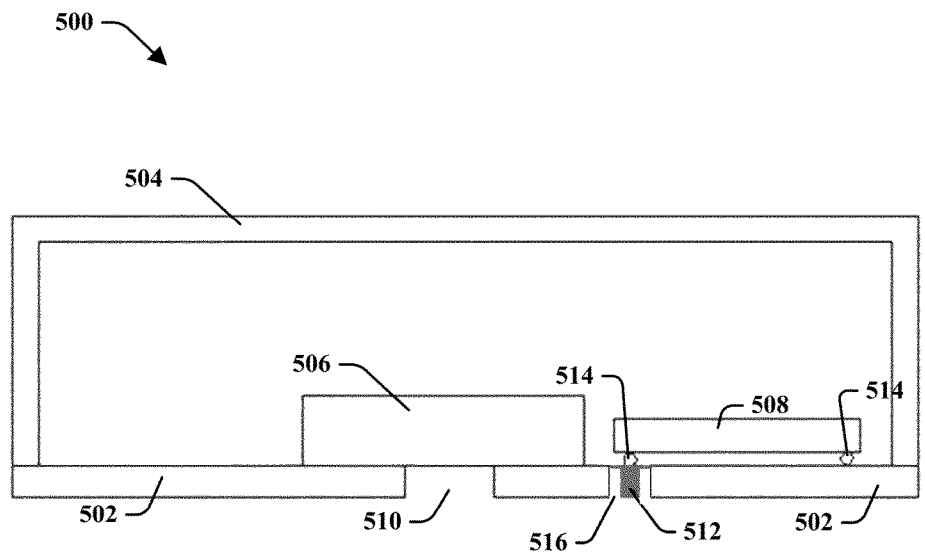
FIG. 5 depicts a non-limiting schematic diagram of an exemplary integrated sensor and microphone package with a thermally conductive channel in a substrate according to various non-limiting aspects of the subject disclosure.

Turning now to FIG. 5, illustrated is a non-limiting schematic diagram of an exemplary integrated sensor and microphone package 500 with a thermally conductive channel in a substrate according to various non-limiting aspects of the subject disclosure The embodiment shown in FIG. 5 is a variation of the embodiment shown in FIG. 4. In FIG. 5, the thermally conductive channel 512 can be formed in the substrate 502 to facilitate the temperature sensing portion on the ASIC 508 to accurately detect the ambient air temperature even without being exposed to the air. The thermally conductive channel 512 can equalize in temperature to the ambient temperature of the surroundings, and then be coupled to a contact 514 of the ASIC 508 that is flip-chip mounted to the substrate 502. The temperature sensing portion of the ASIC 508 can be located adjacent to or near to the contact point 514. The ASIC 508 can be mounted next to a microphone 506 that is mounted over an acoustic port 510. A lid 504 can be formed over the package 500.

In an embodiment, the thermally conductive channel 512 can be formed from copper or another material that has low thermal resistance in order to quickly equalize in temperature with the surroundings. An airgap 516 can also be formed around the thermally conductive channel 512 in order to further insulate the thermally conductive channel from the heat sink substrate 502. Thus the thermally conductive channel can be thermally and electrically isolated from the substrate 502 further improving the accuracy and sensitivity of temperature measurements by the temperature sensor on the ASIC 508. The thermally conductive channel 512 can be a via that is formed in the substrate and then the area around the via can be ablated away. This ablation can remove organic material (that which usually constitutes substrates based on PCB manufacturing).

Figure 6:
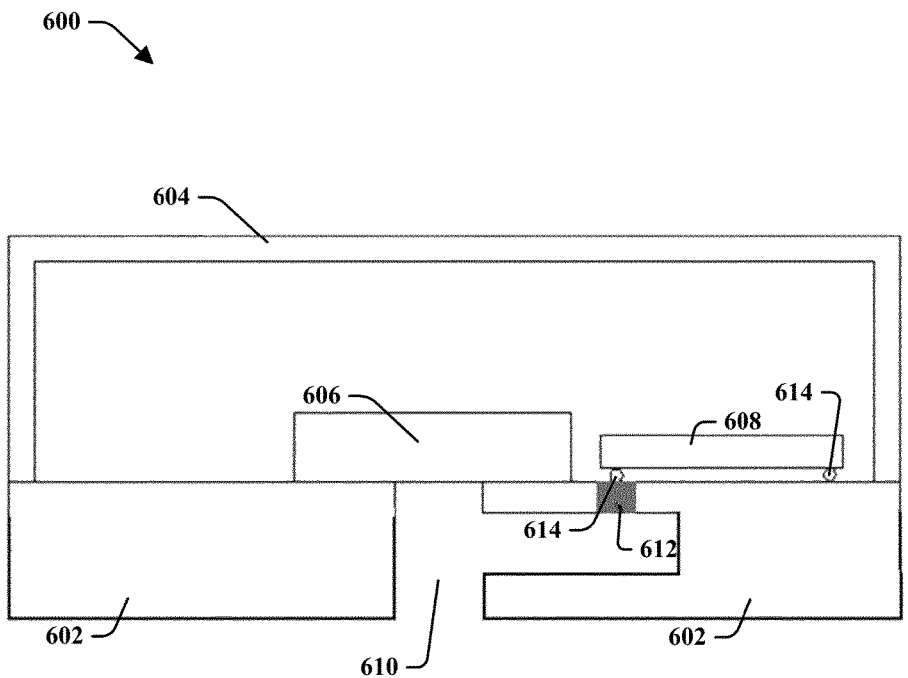
FIG. 6 depicts a non-limiting schematic diagram of an exemplary integrated sensor and microphone package with a thermally conductive channel with an air port according to various non-limiting aspects of the subject disclosure.

Turning now to FIG. 6, illustrated is a non-limiting schematic diagram of an exemplary integrated sensor and microphone package 600 with a thermally conductive channel with an air port according to various non-limiting aspects of the subject disclosure.

The embodiment shown in FIG. 6 is a variation of the embodiment shown in FIG. 5. In FIG. 6, the thermally conductive channel 612 can be formed in the substrate 602 to facilitate the temperature sensing portion on the ASIC 608 to accurately detect the ambient air temperature even without being exposed to the air. The thermally conductive channel 612 can equalize in temperature to the ambient temperature of the surroundings, and then be coupled to a contact 614 of the ASIC 608 that is flip-chip mounted to the substrate 602. The temperature sensing portion of the ASIC 608 can be located adjacent to or near to the contact point 614. The ASIC 608 can be mounted next to a microphone 606 that is mounted over an acoustic port 610. A lid 604 can be formed over the package 600. The acoustic port 610 can be formed such that a portion of the acoustic port extends over to the thermally conductive channel 612.

Exemplary Methods

Figure 7:
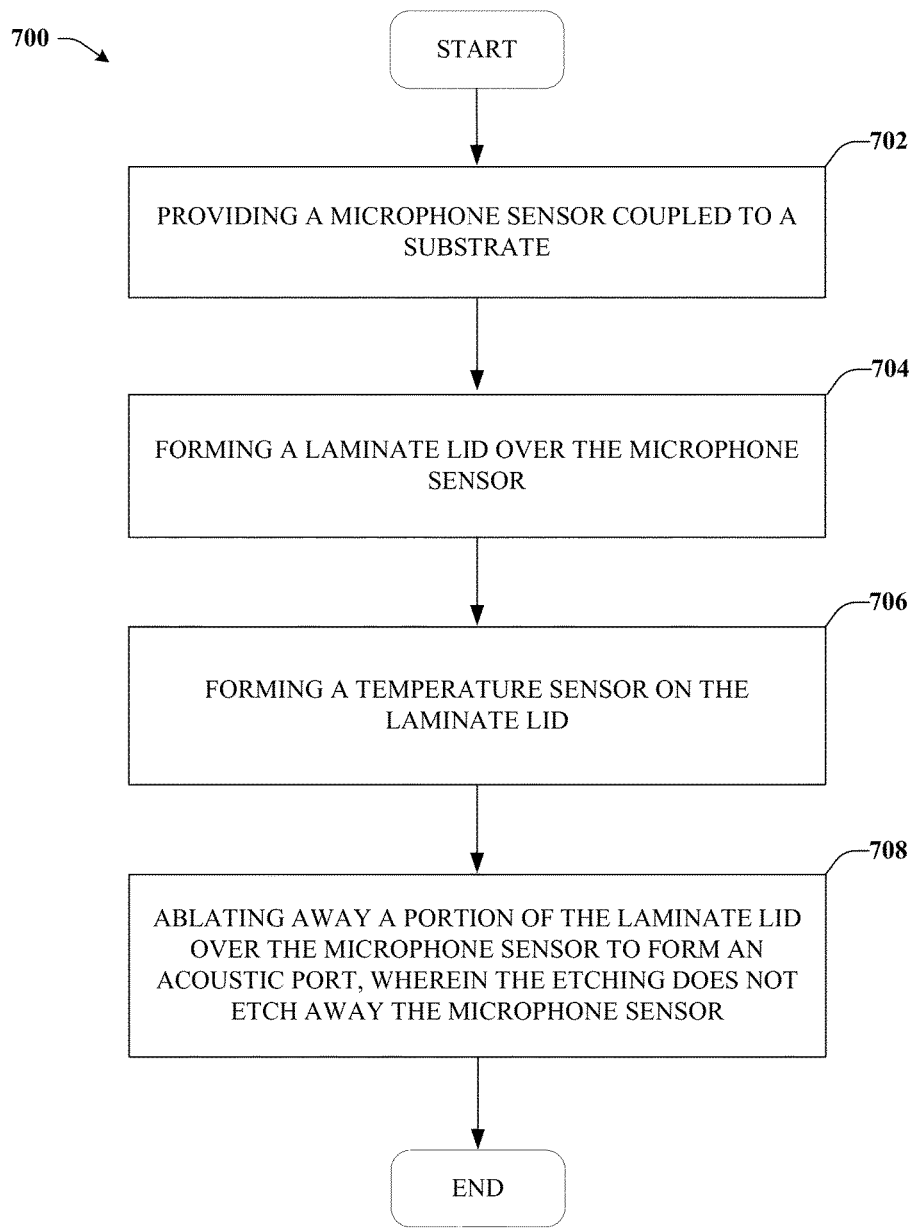
FIG. 7 depicts an exemplary flowchart of non-limiting methods associated with a forming an integrated sensor and microphone package according to various non-limiting aspects of the disclosed subject matter.

In view of the subject matter described supra, methods that can be implemented in accordance with the subject disclosure will be better appreciated with reference to the flowchart of FIG. 7. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

FIG. 7 depicts an exemplary flowchart of a non-limiting method 700 associated with a forming an integrated sensor and microphone package according to various non-limiting aspects of the disclosed subject matter. As a non-limiting example, exemplary method 700 can facilitate forming an integrated sensor and microphone package. The method 700 can start at 702 where the method includes providing a microphone sensor coupled to a substrate. The microphone sensor can be a MEMs microphone in some embodiments, and in some embodiments can be flip-chip attached to the substrate. In other embodiments, the MEMs microphone can be mounted (e.g., flip-chipped) to an ASIC that is mounted to the substrate. In other embodiments, the ASIC can be embedded into the substrate.

At 704, the method includes forming a laminate lid over the microphone sensor. The laminate lid can be formed from materials that make the laminate lid susceptible to laser ablation or etching.

At 706, the method includes forming a temperature sensor on the laminate lid. In an embodiment, the temperature sensor can be a thermocouple. In other embodiments, other types of temperature sensing devices can be utilized including resistance thermometers, where the resistance thermometer is a single homogenous metal alloy that has a very high temperature coefficient of resistance. When the temperature changes, the resistance changes which can be measured to determine changes in temperature. In other embodiments, other types of temperature sensors such as thermostats and/or thermistors.

At step, 708, the method includes ablating away a portion of the laminate lid over the microphone sensor to form an acoustic port, wherein the etching does not etch away the microphone sensor or the temperature sensor.

It is to be appreciated that various components described herein can include electrical circuit(s) that can include components and circuitry elements of suitable value in order to implement the embodiments of the subject innovation(s). Furthermore, it can be appreciated that many of the various components can be implemented on one or more integrated circuit (IC) chips. For example, in one embodiment, a set of components can be implemented in a single IC chip. In other embodiments, one or more of respective components are fabricated or implemented on separate IC chips.

What has been described above includes examples of the embodiments of the present disclosure. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize. Moreover, use of the term "an embodiment" or "one embodiment" throughout is not intended to mean the same embodiment unless specifically described as such.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned diagrams/systems/circuits/modules have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A device, comprising:
   a microphone sensor coupled to a first side of a substrate;
   an acoustic port in the substrate that exposes a portion of the microphone sensor; and
   a temperature sensor mounted on a second side of the substrate that overlays a portion of the port.

2. The device of claim 1, wherein the substrate is a laminate lid over the microphone sensor.

3. The device of claim 2, wherein the temperature sensor extends over the acoustic port in the laminate lid.

4. The device of claim 1, wherein the temperature sensor is a resistance thermometer.

5. The device of claim 1, wherein the temperature sensor is a thermocouple.

6. The device of claim 1, wherein the microphone sensor is a microelectromechanical systems sensor.

7. The device of claim 1, wherein the temperature sensor is integrated onto an application specific integrated circuit that is embedded into the substrate.

8. The device of claim 7, wherein a portion of the application specific integrated circuit comprising the temperature sensor extends into the acoustic port.

9. The device of claim 1, wherein the temperature sensor is integrated onto an application specific integrated circuit, wherein the application specific integrated circuit is disposed between the substrate and the microphone sensor.

10. The device of claim 9, wherein the microphone sensor and the application specific integrated circuit sensor form an integrated die.

11. The device of claim 10, wherein a connection between the integrated die and the substrate is a flip chip connection.

12. The device of claim 1, wherein a width of the temperature sensor is between 75 and 100 microns.

13. A device, comprising:
    a microphone sensor coupled to a substrate;
    an acoustic port in the substrate that exposes a portion of the microphone sensor;
    an application specific integrated circuit that is embedded into the substrate and wherein a portion of the application specific integrated circuit extends into the acoustic port; and
    a temperature sensor that is integrated into a portion of the application specific integrated circuit that extends into the acoustic port.

14. The device of claim 13, wherein the temperature sensor is a resistance thermometer.

15. The device of claim 13, wherein the temperature sensor is a thermocouple.

16. The device of claim 13, wherein the microphone sensor is a microelectromechanical systems sensor.

17. The device of claim 13, wherein the application specific integrated circuit is less thermally conductive than the substrate.

18. A device, comprising:
    a microphone sensor mounted to a first side of the application specific integrated circuit, wherein the application specific integrated circuit has an aperture that exposes a portion of the microphone sensor;
    a substrate that is coupled to a second side of the application specific integrated circuit, that has an acoustic port formed that exposes the aperture; and
    a temperature sensor that is integrated into the application specific integrated circuit, wherein the temperature sensor overlays a portion of the acoustic port.

19. The device of claim 18, wherein the microphone sensor and the application specific integrated circuit sensor form an integrated die.

20. The device of claim 19, wherein a connection between the integrated die and the substrate is a flip chip connection.

21. The device of claim 18, wherein the application specific integrated circuit is less thermally conductive than the substrate.

* * * * *